United States Patent [19]
Annable

[11] Patent Number: 5,898,992
[45] Date of Patent: May 4, 1999

[54] METHOD OF MOUNTING CIRCUIT COMPONENTS ON A FLEXIBLE SUBSTRATE

[75] Inventor: Garth Annable, Long Eaton, United Kingdom

[73] Assignee: Pressac Limited, United Kingdom

[21] Appl. No.: 08/839,236

[22] Filed: Apr. 24, 1997

[30] Foreign Application Priority Data

Apr. 30, 1996 [GB] United Kingdom .................. 9608847

[51] Int. Cl.[6] .................................................. H05K 3/34
[52] U.S. Cl. .......................... 29/840; 29/843; 228/123.1; 228/180.1
[58] Field of Search .............................. 29/840, 843, 739, 29/834, 605; 228/254, 123.1, 180.1, 180.2; 205/118; 148/24; 427/304; 269/303; 361/790, 784

[56] References Cited

U.S. PATENT DOCUMENTS

| | | | |
|---|---|---|---|
| 3,851,758 | 12/1974 | Makhijani et al. | 29/760 X |
| 4,659,592 | 4/1987 | Sirinyan et al. | 427/304 |
| 4,664,366 | 5/1987 | Lane et al. | 269/303 |
| 4,733,462 | 3/1988 | Kawatani | 29/834 X |
| 4,785,257 | 11/1988 | Bernard et al. | 29/605 |
| 4,967,950 | 11/1990 | Legg et al. | 228/180.2 |
| 5,116,433 | 5/1992 | Davis et al. | 148/24 |
| 5,205,032 | 4/1993 | Kuroda et al. | 29/760 X |
| 5,210,939 | 5/1993 | Mallik et al. | 29/739 X |
| 5,418,688 | 5/1995 | Hertz et al. | 361/790 |
| 5,479,319 | 12/1995 | Werther | 361/784 |
| 5,597,469 | 1/1997 | Carey et al. | 205/118 |

FOREIGN PATENT DOCUMENTS

| | | |
|---|---|---|
| 0 568 087 A2 | 4/1993 | European Pat. Off. . |
| 4405784 A1 | 2/1994 | Germany . |

OTHER PUBLICATIONS

SIPAD circuit board technology: Soldering SMDs without soler paste; Werner Maiwald; 8229 Siemens Components; 27 (1992) Nov./Dec., No. 6 Berlin, DE.

Primary Examiner—Peter Vo
Assistant Examiner—Rick Kiltae Chang
Attorney, Agent, or Firm—Nikolai, Mersereau & Dietz, P.A.

[57] ABSTRACT

This invention is concerned with improvements in or relating to methods of mounting circuit components on flexible substrates and, in particular, surface mounting components to the conductors of printed circuits on flexible substrates having relatively low temperature heat resistance using soldering techniques. A carrier assembly and the assembled circuits are also part of the invention.

29 Claims, 3 Drawing Sheets

METHOD OF MOUNTING CIRCUIT COMPONENTS ON A FLEXIBLE SUBSTRATE

BACKGROUND OF THE INVENTION

I. Field of the Invention

This invention is concerned with improvements in or relating to methods of mounting circuit components on flexible substrates and, in particular, surface mounting components to the conductors of printed circuits on flexible substrates having relatively low temperature heat resistance.

One well known method of mounting circuit components on rigid substrates in the manufacture of printed circuits is referred to as surface mounting. In this method, the components are positioned in the desired location on the surface of the printed circuit substrate and connected to the conductors of the circuit by reflow soldering techniques which are well known in the manufacture of printed circuits. In reflow soldering, the printed circuit substrate and the components are exposed to relatively high temperatures in order to activate the solder paste. It has also been proposed to surface mount components on flexible printed circuit substrates but, in so doing, care must be taken to ensure that the substrate is sufficiently resistant to the reflow soldering temperatures. Many film materials, including polyesters, have not been used satisfactorily for surface mounting components because of inadequate heat resistance and dimensional stability. In practice, only flexible circuit substrates of polyimide film have been found to be suitable for surface mounting of components, in view of the resistance of polyimide films to the temperatures encountered in reflow soldering.

Flexible printed circuit substrates are used extensively for some purposes, usually where a rigid substrate cannot be easily accommodated in the space available. One common use of flexible printed circuits is for vehicle instrument clusters but these circuits have been relatively simple and have not required surface mounting of components.

Most of these simple flexible printed circuits, especially for use in automobile instrument clusters, have used flexible polyester film to provide the flexible substrate. Flexible polyester films are much cheaper than polyimide films, approximately one quarter or one fifth of the price of polyimide films, but polyester films have much lower softening points than polyimide and, in general, are unstable at the temperatures commonly found in reflow soldering.

II. Related Art

SUMMARY OF THE INVENTION

The present invention manifests itself in unique aspects including an improved method of mounting circuit components to conductors of printed circuits on flexible substrates having much lower softening temperatures or levels of heat resistance than known polyimide substrates. The invention further includes a carrier assembly for use in processing the flexible printed circuit substrate and the flexible printed circuits themselves.

In one aspect the invention may be considered to provide a method of mounting circuit components to conductors of printed circuits on a flexible substrate that generally includes the following steps:

(a) providing a flexible substrate having a surface carrying electrical conductors;

(b) locating the substrate in a first predetermined position on a support;

(c) locating a cover having at least one opening therein in a second predetermined position on the support and clamping the cover and the support together to provide a carrier assembly in which the substrate is clamped between the support and the cover. The one or more openings in the cover are positioned and shaped so as to leave exposed a selected region or regions of the substrate carrying the selected parts of the conductors on which the components are to be placed;

(d) either before or after locating the cover in the second predetermined position, applying solder paste to selected parts of the conductors;

(e) placing components on the substrate with contacts of the components in engagement with the solder paste;

(f) exposing the carrier assembly to heat to preheat the deposited solder paste to a first elevated temperature;

(g) thereafter exposing the deposited solder paste to further heat to raise the solder paste to a second elevated temperature whereby to soften the solder paste; and (h) allowing the solder paste to cool or cooling the solder paste whereby to cause it to solidify and adhere firmly to the conductors and the contacts of the components.

Conveniently the support is provided by a carrier plate for the substrate, on which separate substrates are mounted and transported through the various stages of a method in accordance with the invention. Alternatively, the substrates may be supplied in continuous form each substrate connected to the next, if necessary, by intermediate connecting portions, and the or each support positioned to support a substrate region as it is moved through the stages of the method. The substrates may thus be supplied in reel form, being unwound from the reel for carrying out a method in accordance with the invention and either severed to form separate substrates having components mounted thereon at the completion of the step of the method, or reeled up again for transport to another location and subsequent separation, as necessary.

Preferably, the support and the cover sides, remote from the substrate, each have a reflective surface and the heat provided to raise the solder paste to the first elevated temperature is radiant heat. The reflective surfaces of the support and carrier remote from the substrate are adapted to reflect radiant heat. Other sources of heat, e.g., hot gas may, in some circumstances, be used instead of, or in addition to, radiant heat in the process.

In carrying out a method in accordance with the invention, the solder paste may be applied to the selected parts of the conductors by any suitable solder-paste applying means. A preferred means is an extrusion dispensing process but other means may be used, for example, printing, e.g., screen printing or an impression type of printing process. Although for some application method, e.g., extrusion dispensing, it is preferred that the substrate be clamped between the cover and support before the solder paste is applied, for some application methods, e.g., screen printing it may be desirable to apply the solder paste before the cover is located on the support.

In accordance with the preferred method of the invention, the support and the cover are made of a conductive material, suitably a heat resistant carbon fibre composite material, or the like, whereby to dissipate heat away from the region of the substrate on which the components are placed. Also, an edge portion of the cover around the opening preferably tapers from the outer surface of the cover towards an edge defining the opening.

Preferably, the further heat which softens the solder paste is supplied by a jet of hot gas which is directed at a restricted area. Suitably, the jet of hot gas extends transversely over a width at least as great as that of the assembly but is very narrow in a direction transverse to that in which the jet extends. To accomplish this, the assembly may be conveniently traversed past or moved relative to the jet so that the exposed surface region of the substrate on which the components are placed is exposed to the jet for but a short time, sufficient only to raise the temperature of the solder paste to fully activate the solder.

A method in accordance with the invention is especially suitable for use where the flexible substrate has a softening point at or lower than the second temperature or softening point of the solder. The flexible substrate is preferably a polyester film with a relatively low shrink factor. Typically, the shrink factor of the polyester film is not more than 0.1% at a temperature of 160° C.

Preferably, in carrying out a method in accordance with the invention, the circuit conductors are copper and, suitably, selected parts of the conductors, commonly referred to as contact pads, are provided with a tin coating or otherwise treated to enhance the ease of soldering.

According to another aspect of the invention, a carrier assembly is provided for carrying and presenting a flexible substrate for the mounting of circuit components to conductors of a printed circuit on a selected region of the substrate. The carrier assembly includes a support, first locating means for locating a substrate in a first predetermined position on the support, a cover having an opening in it. The locating means locates the cover in a second predetermined position on the support relative to a substrate positioned on the support in the first predetermined position such that when the substrate is clamped between the support and the cover. The opening or openings in the cover leaves only the selected region or regions of the substrate containing the circuit components to be soldered exposed. The carrier assembly includes clamping means for clamping the support and the cover together and capturing a substrate located therebetween on the support in said first predetermined position.

In carrying out a method in accordance with the invention the mass of the carrier assembly is preferably kept as low as possible. A preferred method of reducing the mass of the assembly is to provide holes or openings through the assembly at positions which are not aligned with the substrate.

It is important that the flexible substrate is accurately located on the support, in a position such that the surface region of the substrate on which the components are to be mounted is in register or proper alignment with the opening in the cover. Means are therefore preferably provided to locate the substrate accurately on the support and to locate the cover relative to the support in a desired position. Preferably, the substrate is located on the support by engagement of a plurality of first location pegs on the support, in holes in the substrate (accurately located in relation to the surface region on which the components are to be mounted). Conveniently, the cover is located on the support by engagement of a plurality of second location pegs on the support that are aligned with holes in the cover such that the opening in the cover is in register or proper alignment with the surface region of the flexible substrate. The substrate may, however, be located or positioned on the support in any convenient manner, for example, the substrate may be located by means of a recess in the support complementary in shape to the shape of the substrate.

The edge of the opening in the cover is closely spaced from the components to leave exposed as small a surface region of the flexible substrate as possible. Where components are to be surface mounted at several regions which are spaced apart from one another, the cover may be provided with several appropriately located openings in register with regard to each of the surface regions on which the components are to be placed.

In accordance with the invention, the cover may be clamped to the support (thereby to clamp the substrate between the support and cover) by any suitable means. One suitable clamp means comprises latch means carried by the support, having a cam surface cooperating with a cam face on the cover such that when the latch means is urged towards a clamping position the cam surface and cam face cooperate to apply clamping pressure between the cover and support.

In carrying out a method in accordance with the invention, any convenient solder paste (solder formula) may be used provided that it can be activated (softened or caused to flow) at a suitable temperature. One suitable solder paste has a melting temperature of about 187° C. In this paste, the solder mixture consists of about 63% tin and about 37% lead by weight. In some circumstances, it may be preferred, when carrying out a method in accordance with the invention, to use a solder paste having a relatively low activation temperature, for example, of about 163° C. One such solder paste having a relatively low activation temperature includes a solder mixture consisting of about 43% tin, 43% lead and 14% bismuth, by weight. The second elevated process temperature is normally about 220° C., in carrying out a preferred method in accordance with the invention; this is considerably higher than the softening point of the flexible polyester substrates and the temperature at which they might be expected to shrink or distort if handled by previously known methods of surface mounting.

In a further aspect, the invention also provides a flexible printed circuit comprising a flexible substrate which is a flexible polyester film having a surface carrying electrical conductors and carrying circuit components secured to the conductors of the flexible substrate by solder.

BRIEF DESCRIPTION OF THE DRAWINGS

The above and other of the various object and several features of the present invention will become more clear from the following description, to be read with reference to the accompanying drawings, of a method of mounting surface components to conductors of printed circuits on a flexible substrate, embodying the invention. It will be realized that this method has been selected for description by way of example and not limitation.

In the accompanying drawings.

DETAILED DESCRIPTION

Figure 1:
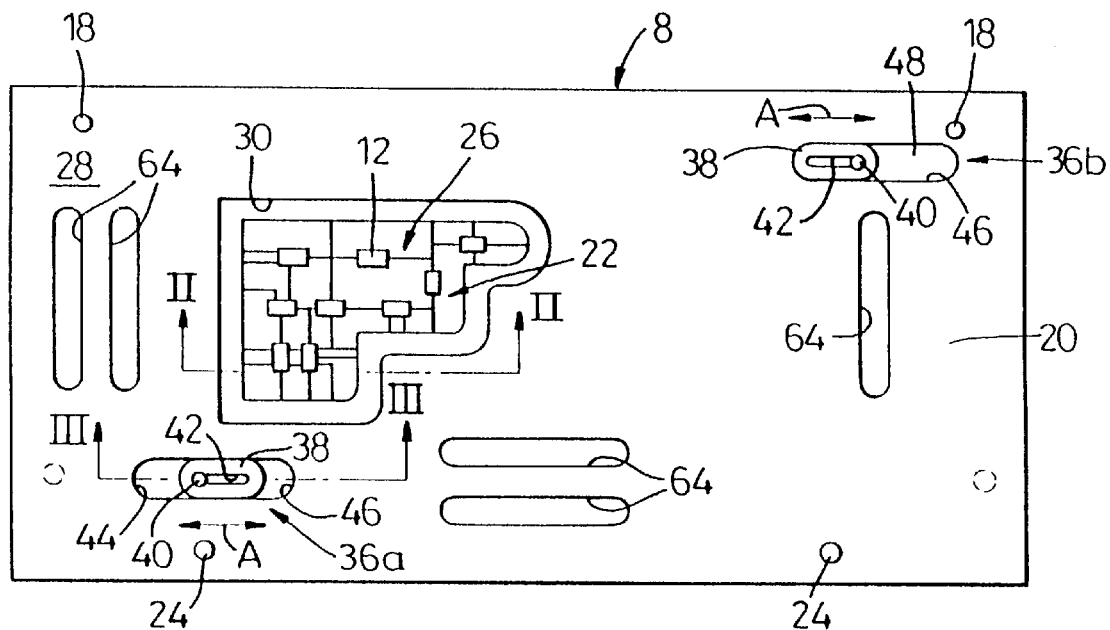
FIG. 1 is a plan view of a carrier assembly suitable for use in carrying out a method embodying the invention.

In accordance with the invention, an exemplary preferred method of mounting circuit components to conductors of printed circuits on a flexible substrate 10 (FIG. 2) has been found. The steps to be carried out will now be described.

The preferred substrate is a polyester film having a low shrink factor which is commercially available from ICI and other sources. This preferred film is specified by ICI to shrink not more than 0.1% when exposed to a temperature of 160° C. Copper conductors may be formed on the surface of the polyester substrate in a well-known manner; however, unusually, the contact pads of the conductors are further electroplated with a layer of tin. This is to provide an optimum surface for soldering. Alternatively, a good soldering surface may be provided on bare copper by any of several methods. For example, if it is first pre-cleaned or if, in the subsequent reflow soldering operation, a very aggressive flux is used. As further alternatives, the copper conductors may be coated with an organic solderability preservative or aqueous preflux. However, these alternative possibilities are less desirable than coating the contact pads with a layer of tin.

In carrying out the illustrative method, and as illustrated in the Figures, the substrate 10 is located in a first predetermined position on a support, namely a flat carrier plate 14 formed of a carbon fibre composite material or the like which has relatively good heat conduction properties. The surface 16 of the carrier plate 14 remote from the flexible substrate 10 is reflective: this reflective surface may be provided in any convenient manner, for example by adhering heat reflective aluminum foil to the carrier plate 14.

The substrate 10 is located on the carrier plate 14 by engagement of pegs 18 in location holes (not shown) which are a close fit to the pegs provided, in the flexible substrate in a predetermined position relative to the pattern formed by the conductors of the printed circuit on the substrate 10.

Having located the substrate 10 on the carrier plate 14, a cover 20 having an opening 22 therein is located in a second predetermined position on the carrier plate 14 as by engagement of pegs 24 projecting from the carrier plate, in corresponding locating holes in the cover 20. The cover 20 is located on the carrier plate 14 and relative to the substrate 10 which is also located on the carrier plate such that the opening leaves exposed a region 26 of the substrate 10 on which components 12 are to be placed. Preferably, the various pegs and corresponding holes are of different diameters so that the flexible substrate 10 and the cover 20 can only be located on the carrier plate 14 in one orientation.

The cover 20 is also in the form of a flat plate made of a carbon composite material or the like which has relatively good heat conductivity, similar to the material from which the carrier plate 14 is made. Outer surface 28 of the cover 20 is reflective and may be provided in a manner similar to the heat reflective surface of the carrier plate.

Figure 2:
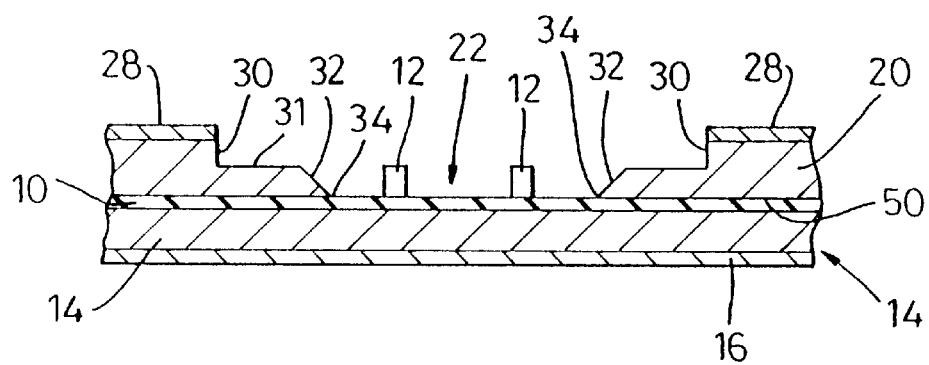
FIG. 2 is a view with parts broken away in section on the line II—II of FIG. 1.

As can be seen viewing FIGS. 1 and 2, the surface of the cover 20 around the opening 22 is formed with a recess 30, the recess 30 generally following the shape of the opening 22. An edge portion 32 of the cover 20 around the opening tapers from a surface 31 of the recess 30 generally parallel with a flat lower surface 50 of the substrate 10, to an edge 34 which defines the opening 22. The contour of the opening 22 is such that the edge 34 defining the opening 22 will generally be at a preselected distance from the nearest component; this distance will conveniently be about 3 mm. The wall defining the recess 30 will also follow the edge 34, preferably, spaced from the edge by a further 5 mm.

In carrying out the illustrative method, both the carrier plate 14 and the cover 20 are about 4 mm in thickness and the thickness of material between the bottom of the recess 30 and the flat lower surface 50 of the cover 20 is about 2 mm.

Figure 3:
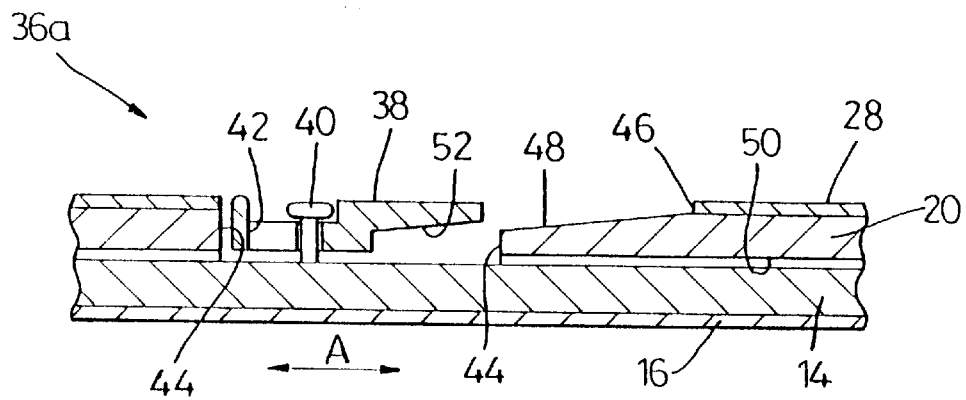
FIG. 3 is a view in section on the line III—III of FIG. 1.

The carrier plate 14 and cover 20 are clamped together by any suitable clamp means, for example screw fasteners with the substrate 10 sandwiched therebetween to provide a carrier assembly 8. In carrying out the preferred illustrative method, the clamping is effected by sliding catch means 36a, 36b (see FIGS. 1 and 3). The catch means each comprise a sliding catch member 38 carried by a stud 40 secured to and projecting from the surface of the carrier plate 14 on which the substrate is located. The catch member 38 is provided with a slot 42 in which the stud 40 is received so that the catch member can slide to and fro in a direction indicated by the arrows A on FIGS. 1 and 3.

Each catch member 38 and stud 40 are located on the carrier plate 14 in such a position that when the cover 20 is positioned in the second predetermined position, i.e., fully left (FIGS. 1 and 3) on the carrier 14, the catch member 38 in its inoperative condition is aligned with an opening 44 which extends through the cover 20: the catch means 36b is shown in that condition. To one side of the opening 44 the surface of the cover 20 remote from the flexible substrate is provided with a recess 46. A bottom face 48 of the recess terminates adjacent the opening 44. The portion of the bottom surface 48 is spaced from the surface 50 of the cover by a distance such that the catch member 38 will just clear the edge of the cover defining the opening recess when the catch member 38 is slid on the stud 40 from its position aligned with the hole 44 into recess 46.

The catch member 38 has an undersurface 52 which is arranged to contact the bottom surface 48 of the recess of the catch member 38, as the member 38 is slid toward the right (FIGS. 1 and 3) into the recess in the direction of the arrow A. The surface 48 is included, diverging from the surface 50 of the cover 20 considered from the opening 44. The cam surface 52 of the catch member 38 is also inclined and is substantially parallel with the cam face 48 on the cover. Thus, when the catch member 38 is slid into the recess 46, the cam surface 52 on the catch member 38 comes into engagement with the cam surface 48 on the cover 20 and further movement of the catch member 38 into the recess 46 tends to urge the cover 20 towards the carrier plate 14 thus clamping the cover 20 firmly against the carrier plate 14. The angles of the cam surface 52 and cam face 48 are relatively shallow and frictional engagement between the cam surface 52 of the catch member 38 and the cam face 48 of the cover 20 is sufficient to retain the cover 20 clamped against the carrier plate until the catch member is released, for example, by an operator. As can be seen viewing FIG. 1, two catch means 36 are provided in the carrier assembly 8.

When the carrier assembly 8 is complete with the flexible substrate clamped between the cover 20 and carrier plate 14, the assembly 8 is positioned in a machine for automatically extrusion dispensing solder paste. This machine is of a well-known construction and is programmed to deposit a measured amount of solder paste on each contact pad of the flexible printed circuit on the exposed region of the substrate. Any suitable solder paste may be used.

Typically, solder pastes comprise a paste including components of a solder mixture, with flux and a solvent. Suitable solder pastes include a solder mixture comprising about 63% tin and 37% lead by weight; this has a relatively high melting temperature of about 187° C. and is therefore suitable mainly where there are only relatively few components in a simple circuit covering a small area, otherwise the heat to which the flexible substrate is exposed, despite the various measures of the illustrative method, will be likely to damage the flexible substrate.

Another satisfactory solder paste has a solder mixture consisting of about 43% tin, 43% lead and 14% bismuth by weight. This latter composition is activated at relatively low temperatures, at a temperature of about 163° C. This low temperature solder paste is somewhat easier to use than the former paste in view of the fact that it can be activated at rather lower temperatures and it is therefore easier to use this paste where the circuit is larger and more complex.

After the solder paste has been applied to the selected parts of the conductors in the exposed region of the substrate, components are placed on the substrate with the contacts of the components in engagement with the solder paste which has previously been applied to the contact pads of the printed circuit. The components are positioned by any suitable means, conveniently a surface mount machine where components are picked from a supply of known structure, for example, a tape type feeder, a magazine feeder or other suitable supply and placed at a preselected position on the printed circuit. The carrier assembly 8 is mounted in the machine in known fashion. Such surface mounting equipment is well known to those skilled in the art.

Figure 4:
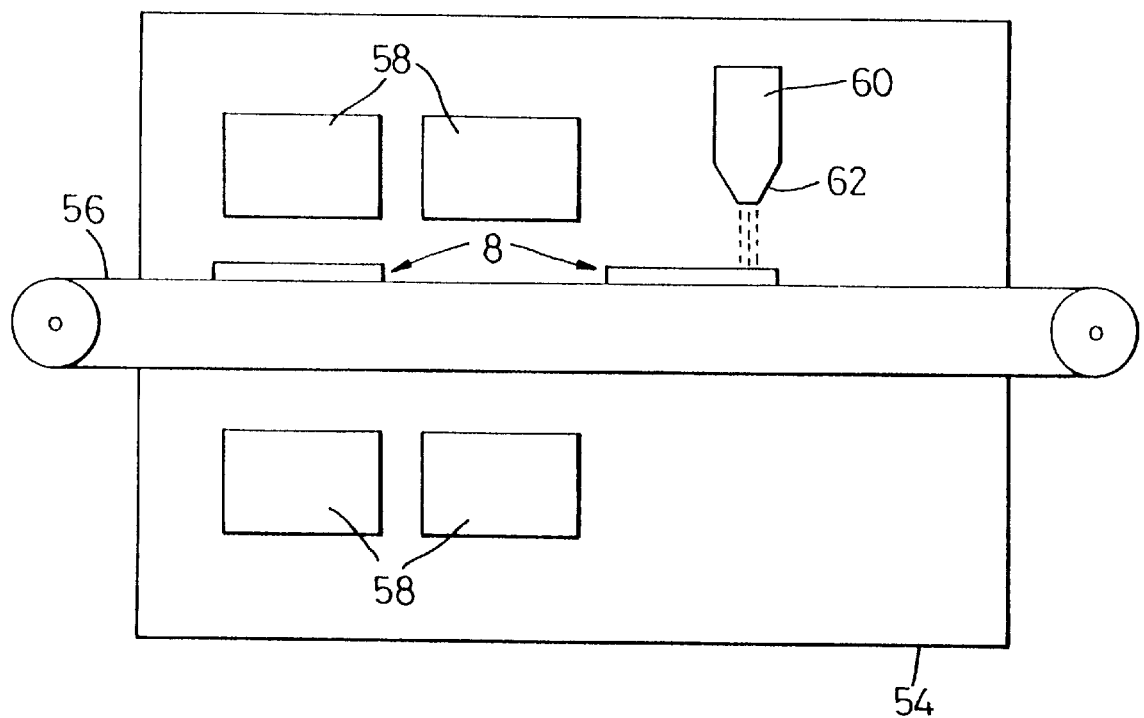
FIG. 4 is a diagrammatic side view of a reflow oven suitable for use in carrying out a method embodying the invention.

After the components have been placed on the substrate, the carrier assembly 8 is transferred into heating equipment. As seen in FIG. 4, the heating equipment used in carrying out the illustrative method is a reflow oven 54 in which the carrier assemblies are supported on parallel chains of a chain conveyor 56 which are spaced apart a sufficient distance to support the carrier assemblies at edge regions. The chain conveyor 56 is then moved to propel the carrier assemblies through the oven 54; the chains are driven at an appropriate speed. The oven 54 comprises a plurality of radiant heaters 58 (normally gas fired radiant heaters) which are positioned to direct radiant heat towards the upper and lower surfaces of carrier assemblies being transported through the oven 54 by the chain conveyor 56. Much of the radiant heat is reflected from the carrier assemblies by the reflective surfaces 16, 28, but within the opening 22, the radiant heat is absorbed by the solder paste and components (and to some degree by the flexible film). However, it is believed that the flexible film is to some extent itself transparent to the radiant heat. Radiant heat falling on the carrier plate 14 beneath the exposed region of the flexible substrate 10 is believed to be absorbed by the carrier plate 14 (which is suitably a dark color, for example, dark gray, blue or black and therefore, a relatively good absorber of heat) and dissipated throughout the bulk of the carrier plate 14 (and the cover 20 where the cover and carrier plate have good contact with one another). The temperature of the radiant heaters is typically well above that at which the flexible substrate would be damaged if the substrate itself were heated to that temperature, typically ranging between 250 and 370° C., usually of the order of 320° C. At this stage, with the conveyor operating at normal speed, the heat absorbed will raise the temperature of the carrier plate 14 to a temperature of the order of 90° C.

As can be seen from the drawings, the radiant heaters 58 are provided both above and below the path of travel of the carrier assembly 8 through the oven 54. It is preferred to provide radiant heat at both sides of the carrier plate assembly 8 but, if desired, radiant heat may be directed at only one face of the carrier assembly, preferably at the cover 20 from above.

After the carrier assembly 8 has been sufficiently heated in the preheating stage, it is carried beneath a so-called "air-knife" 60. The air-knife 60 has a slit nozzle 62 which extends across the chain conveyor 56 and therefore across the whole width of the carrier assembly 8. The air-knife 60 ejects at an elevated temperature in a narrow jet from the nozzle 62. As the conveyor chains 56 transport the carrier assembly beneath the air-knife 60, the assembly 8 is subjected to a jet of hot air. The oven is provided with detection means which cause the air knife to be switched on at the approach of the carrier assembly 8. Because this is a very narrow jet, its effect is to raise the temperature of the solder paste to its activation temperature but only for a relatively short period of time, sufficiently short to avoid significant damage to the flexible substrate 10, but the time is sufficient to cause the solder mixture to melt and bond the contacts of the circuit component to the pads of the conductor to which they are adjacent.

The air ejected from the nozzle 62 of air-knife 60 is typically at a temperature of about 320° C. This is sufficient to raise the temperature of the solder paste momentarily to a temperature of about 220° C. or possibly a little more up to about 226° C., sufficient to activate the solder compound and cause it to melt and bond as discussed above. After the exposed region of the circuit has passed beneath the air-knife 60, the temperature rapidly falls so that the activated solder cools and solidifies, adhering firmly to the conductors and to the contacts of the components and providing a good electrical connection between the conductors and contact pads of the components. Cooling may be natural, merely by leaving the assembly in room temperature conditions until the temperature of the assembly has fallen sufficiently, or it may be subjected to forced cooling in a suitable cooling apparatus.

The recess 30 in the cover 20 and the tapered edge portion 32 is believed to facilitate operation of the hot air-knife 60 so that it heats the solder paste more rapidly. It is thought that the tapered edge portion 32 around the opening 22 tends to direct the hot air across the surface of the flexible substrate in the exposed region and possibly reduces the turbulence of the hot air thus further increasing the heating efficiency.

Figure 5:
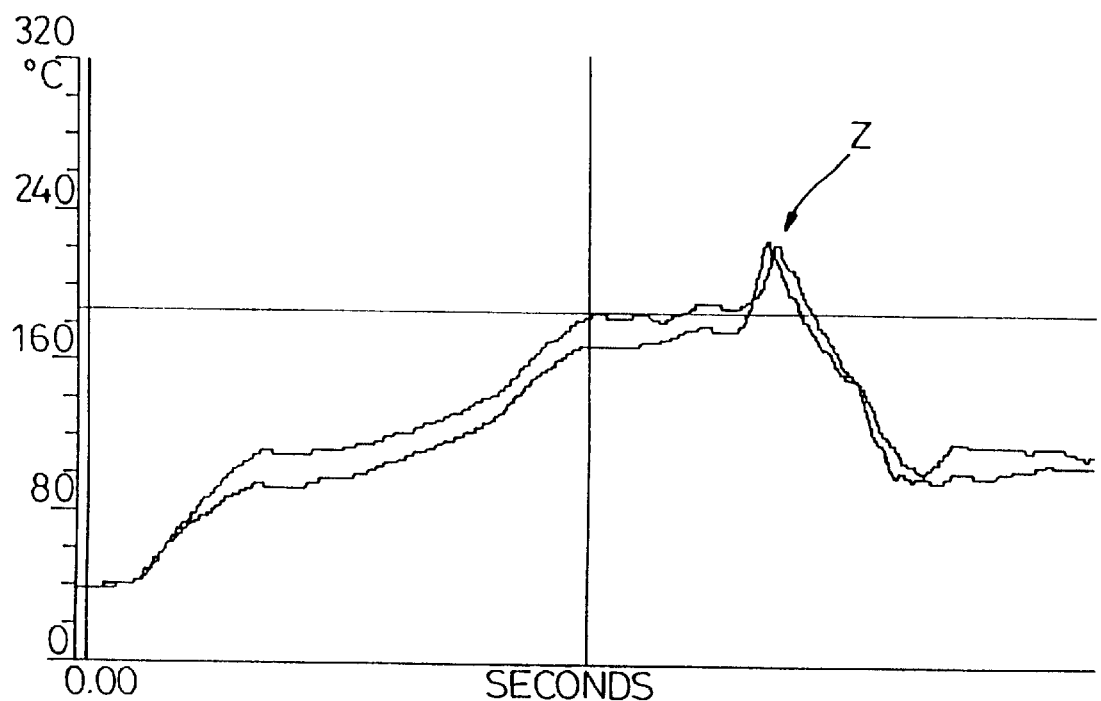
FIG. 5 is a graph showing the temperature profile measured by two probes on the carrier assembly as it passes through the oven.

FIG. 5 is a graph showing the temperature profile measured by two probes on the carrier assembly 8 as it passes through the oven. As can be seen, there is a relatively steady increase in temperature during the preheating section during which solvents in the solder paste are evaporated and the temperature is then maintained steady for a short period during which the fluxes in the solder are activated. A rapid short temperature peak will be noted at region Z of FIG. 5 where the carrier assembly is heated by the air-knife 60.

In carrying out the illustrative method, the carrier plate 14 is provided with precisely positioned holes which are arranged to locate the carrier plate on pegs both in the paste dispensing machine and in the component placing machines, as well as to mount the carrier plate (and thus a carrier assembly 8) on the chains to transport the assembly 8 through the reflow oven.

In carrying out the illustrative method, the mass of the carrier assembly is kept to a minimum by cutting holes 64 at appropriate places through the carrier assembly at positions which are not aligned with the flexible substrate 10. Where there are holes, the radiant heat of the pre-heaters cannot be absorbed by the carrier assembly and the presence of the holes 64 is believed to assist in cooling of the carrier assembly 8 for rapid removal of the finished printed circuits and for reuse of the carrier plate 14 and cover 20. It is important that the temperature of the carrier plate 14 and cover 20 are stabilized at approximately room temperature when the carrier assembly 8 enters the reflow oven 54, otherwise there is risk that the flexible substrate may overheat.

Although in the illustrative method, a single circuit is discussed, it will of course be possible to place a plurality of printed circuit substrates on a suitably configured carrier plate, each in a predetermined position and to complete the carrier assembly by clamping a cover with a plurality of appropriately positioned openings in it, corresponding to the regions of the flexible substrate at which components are to be attached.

In carrying out a method in accordance with the invention, the method may be completely automated using automatic assembly systems to load flexible substrates onto carrier plates and to apply the cover and to transport the completed assemblies through the paste dispensing, surface mounting, reflow oven and cooling stations.

In carrying out the illustrative method, it has been found that the circuit components can be surface mounted to the conductors of printed circuits on a flexible substrate made of polyester film without damaging the film, thereby producing relatively complex flexible printed circuits without it being necessary to use the relatively expensive polyimide film which it has previously been necessary for this purpose.

What is claimed is:

1. A method of mounting circuit components to conductors of printed circuits on a flexible substrate comprising the following steps:
   (a) procuring a flexible substrate having a surface carrying electrical conductors;
   (b) locating the substrate in a first predetermined position on and with reference to a heat-dissipating support;
   (c) locating a heat-dissipating cover having at least one opening therein in a second predetermined position on the support and removably securing the cover and the support together to provide a carrier assembly in which the substrate is held between the support and the cover, said at least one opening in the cover being so positioned and shaped as to leave exposed a selected region of the substrate carrying the selected parts of the conductors on which the components are to be placed;
   (d) applying solder paste to selected parts of the conductors at anytime prior to locating components to be attached on the substrate;
   (e) placing components on the substrate with contacts of the components in engagement with the solder paste;
   (f) preheating the carrier assembly in a first heating step to preheat the deposited solder paste to a first elevated temperature below the softening point of either the flexible substrate or the deposited solder paste;
   (g) thereafter in a second heating step momentarily exposing the deposited solder paste to further rapid localized heating to raise the solder paste to a second elevated temperature above the softening point of said flexible substrate sufficient to melt the solder paste and bond said contacts of said components; and
   (h) causing the solder paste to cool rapidly enough to avoid damage to said substrate and cause said solder paste to solidify and adhere firmly to the conductors and the contacts of the components.

2. A method according to claim 1 wherein an edge portion of the cover around the opening tapers towards an edge defining the opening.

3. A method according to claim 1 having holes through the assembly away from the substrate to reduce the mass of the assembly.

4. A method according to claim 1 wherein the substrate is located on the support by engagement of first location pegs on the support in holes of the substrate.

5. A method according to claim 1 wherein the cover is located on the support by engagement of second location pegs on the support in holes in the cover.

6. A method according to claim 1 wherein the cover is clamped against the support by catch means having a cam surface cooperating with a cam face on the cover.

7. A method according to claim 1 wherein the support and cover comprise heat resistant carbon fibre composite materials.

8. A method according to claim 1 wherein the solder paste includes a solder mixture consisting of about 63% tin and 37% lead by weight.

9. A method according to claim 1 wherein the solder paste is a low activation temperature paste.

10. A method according to claim 1 wherein the solder paste includes a solder mixture consisting of about 43% tin, 43% lead and 14% bismuth by weight.

11. The method of claim 1 wherein applying solder paste step (d) specifically occurs before locating a heat-dissipating cover step (c).

12. The method of claim 11 wherein said first heating step utilizes radiant heating and said second heating step utilizes localized convection heating.

13. A method according to claim 12 wherein heat is supplied in said second heating step by a jet of hot gas.

14. A method according to claim 12 wherein the support and the cover, remote from the substrate, each have a reflective surface.

15. A method according to claim 12 wherein the support and the cover are made of a conductive material to dissipate heat away from the region of the substrate on which the components are placed.

16. The method of claim 1 wherein said first heating step utilizes radiant heating and said second heating step utilizes localized convection heating.

17. A method according to claim 16 wherein heat is supplied in said second heating step by a jet of hot gas.

18. A method according to claim 16 wherein the support and the cover, remote from the substrate, each have a reflective surface.

19. A method according to claim 16 wherein the support and the cover are made of a conductive material to dissipate heat away from the region of the substrate on which the components are placed.

20. A method according to claim 1 wherein the support and the cover, remote from the substrate, each have a reflective surface.

21. A method according to claim 1 wherein the support and the cover are made of a conductive material to dissipate heat away from the region of the substrate on which the components are placed.

22. The method according to claim 1 wherein the solder paste has a melting temperature of about 187° C. and said second elevated temperature is about 220° C.

23. A method according to claim 22 wherein the flexible substrate is a polyester film with a relatively low shrink factor.

24. A method according to claim 23 wherein the shrink factor of the polyester film is less than or equal to 0.1% at a temperature of 160° C.

25. The method according to claim 1 wherein the electrical circuit conductors are copper and selected parts thereof have a tin coating.

26. A method of mounting circuit components to conductors of printed circuits on a flexible substrate comprising the following steps:
   (a) procuring a flexible substrate having a surface carrying electrical conductors;
   (b) locating the substrate in a first predetermined position on and with reference to a heat-conducting support having a reflective surface;

(c) locating a heat-conducting cover having a reflective surface and at least one opening therein in a second predetermined position on the support and removably clamping the cover and the support together to provide a carrier assembly in which the substrate is held between the support and the cover, said at least one opening in the cover being so positioned and shaped as to leave exposed a selected region of the substrate carrying the selected parts of the conductors on which the components are to be placed;

(d) applying solder paste to selected parts of the conductors at anytime prior to locating components to be attached on the substrate;

(e) placing components on the substrate with contacts of the components in engagement with the solder paste;

(f) preheating the carrier assembly using radiant heat in a first heating step to preheat the deposited solder paste to a first elevated temperature below the softening point of either the flexible substrate or the deposited solder paste;

(g) thereafter in a second heating step momentarily exposing the deposited solder paste to a short term localized high convection jet of hot gas to further raise the solder paste to a second elevated temperature above the softening point of said flexible substrate sufficient to melt the solder paste and bond said contacts of said components; and (h) causing the solder paste to cool rapidly enough to avoid damage to said substrate and cause said solder paste to solidify and adhere firmly to the conductors and the contacts of the components.

27. The method of claim 26 wherein applying solder paste step (d) occurs before locating a heat-dissipating cover step (c).

28. A method according to claim 26 having holes through the assembly away from the substrate to reduce the mass of the assembly.

29. A method according to claim 27 having holes through the assembly away from the substrate to reduce the mass of the assembly.

* * * * *